US012805077B2

(12) United States Patent
Zhang et al.

(10) Patent No.: US 12,805,077 B2
(45) Date of Patent: Nov. 17, 2026

(54) LIGHT EMITTING DEVICE AND AMBIENT LIGHT ADJUSTING DEVICE

(71) Applicant: KAISTAR Lighting (Xiamen) Co., Ltd, Xiamen (CN)

(72) Inventors: Jingqiong Zhang, Xiamen (CN); Xiaoling Huang, Xiamen (CN)

(73) Assignee: BRIDGELUX OPTOELECTRONICS (XIAMEN) CO., LTD., Xiamen (CN)

( * ) Notice: Subject to any disclaimer, the term of this patent is extended or adjusted under 35 U.S.C. 154(b) by 629 days.

(21) Appl. No.: 18/356,314

(22) Filed: Jul. 21, 2023

(65) Prior Publication Data

US 2023/0411567 A1 Dec. 21, 2023

Related U.S. Application Data

(63) Continuation-in-part of application No. 18/299,848, filed on Apr. 13, 2023.

(30) Foreign Application Priority Data

Jun. 15, 2022 (CN) ......................... 202210676253.5
Jun. 13, 2023 (CN) ......................... 202310698509.7

(51) Int. Cl.

*H10H 20/851* (2025.01)
*H10H 20/84* (2025.01)
*H10H 29/80* (2025.01)
*H10H 29/851* (2025.01)
*H10W 90/00* (2026.01)

(52) U.S. Cl.

CPC ........ *H10H 20/8513* (2025.01); *H10H 20/84* (2025.01); *H10H 29/851* (2025.01); *H10W 90/00* (2026.01); *H10H 29/842* (2025.01)

(58) Field of Classification Search

CPC ... H10H 20/00–882; H10H 29/00–142; H10H 29/30–962; H10H 20/851–8516; H10H 29/851–8516; H10H 20/84–841; H10H 29/842–8421

See application file for complete search history.

(56) References Cited

U.S. PATENT DOCUMENTS 7,932,531 B2 * 4/2011 Lin ..................... H10W 74/012 257/680
8,304,796 B2 * 11/2012 Fukuda ................ H10K 50/852 359/569
9,214,615 B2 * 12/2015 Tischler ............... H10H 20/851
9,297,502 B2 * 3/2016 Yoon ....................... C03B 19/06
9,541,254 B2 * 1/2017 Yoon ....................... F21V 13/04

(Continued)

*Primary Examiner* — Maliheh Malek
(74) *Attorney, Agent, or Firm* — Hemisphere Law, PLLC

(57) ABSTRACT

A light emitting device is provided. The device includes a red light emitting unit, a blue light emitting unit, a green light emitting unit, and a white light emitting unit. The red light emitting unit includes a first blue light emitting chip and a red fluorescent material, and a dominant wavelength of a light emitted by the red light emitting unit is in a range of 610 nanometers (nm) to 635 nm. By designing the light emitting device into a structure including the red light emitting unit, the blue light emitting unit, the green light emitting unit and the white light emitting unit, and designing the structure of the red light emitting unit, the light emitting device can realize the adjustment of ambient light and color temperature by the four light emitting units, thereby reducing cost.

15 Claims, 7 Drawing Sheets

(56) References Cited

U.S. PATENT DOCUMENTS

| | | | | |
|---|---|---|---|---|
| 9,795,000 | B1 * | 10/2017 | Sooch | H05B 47/16 |
| 9,812,617 | B2 * | 11/2017 | Yoshimura | H10H 20/8513 |
| 10,976,609 | B2 * | 4/2021 | Sato | G02F 1/133603 |
| 11,692,683 | B2 * | 7/2023 | Iwakura | F21S 43/255<br>362/84 |
| 11,817,531 | B1 * | 11/2023 | Li | C09K 11/02 |
| 2004/0207313 | A1 * | 10/2004 | Omoto | C09K 11/0883<br>313/503 |
| 2005/0082974 | A1 * | 4/2005 | Fukasawa | G03B 27/72<br>257/E33.072 |
| 2007/0046176 | A1 * | 3/2007 | Bukesov | C09K 11/08<br>313/496 |
| 2007/0194695 | A1 * | 8/2007 | Yoon | C09K 11/0838<br>313/503 |
| 2007/0215890 | A1 * | 9/2007 | Harbers | G02F 1/133603<br>257/98 |
| 2009/0218592 | A1 * | 9/2009 | Hawker | C08L 83/04<br>257/E33.059 |
| 2012/0314445 | A1 * | 12/2012 | Masuda | G02B 6/0008<br>362/581 |
| 2013/0070168 | A1 * | 3/2013 | Yokota | G02F 1/133603<br>257/89 |
| 2015/0176831 | A1 * | 6/2015 | Zhang | F21S 8/085<br>362/294 |
| 2015/0184837 | A1 * | 7/2015 | Zhang | F21K 9/20<br>362/294 |
| 2015/0192253 | A1 * | 7/2015 | Zhang | F21K 9/232<br>29/25.01 |
| 2015/0204521 | A1 * | 7/2015 | Zhang | F21V 17/168<br>362/294 |
| 2016/0087164 | A1 * | 3/2016 | Kawano | H10H 20/8513<br>257/98 |
| 2016/0091151 | A1 * | 3/2016 | Itoi | G02B 6/0068<br>362/612 |
| 2016/0322539 | A1 * | 11/2016 | Zhang | H10H 20/8506 |
| 2018/0045380 | A1 * | 2/2018 | Li | F21K 9/232 |
| 2018/0103513 | A1 * | 4/2018 | Tseng | H05B 45/00 |
| 2018/0252967 | A1 * | 9/2018 | Li | G02F 1/133608 |
| 2019/0156735 | A1 * | 5/2019 | Wang | G02F 1/133603 |
| 2019/0179191 | A1 * | 6/2019 | Choi | G02B 1/045 |
| 2019/0316035 | A1 * | 10/2019 | Seibald | C09K 11/0883 |
| 2019/0326481 | A1 * | 10/2019 | Seibald | C09K 11/0883 |
| 2019/0349685 | A1 * | 11/2019 | Choi | G02F 1/133608 |
| 2020/0341337 | A1 * | 10/2020 | Sato | G02F 1/133603 |
| 2021/0332965 | A1 * | 10/2021 | Iwakura | F21S 43/255 |
| 2022/0173079 | A1 * | 6/2022 | Pan | A01G 7/045 |
| 2023/0411566 | A1 * | 12/2023 | Zhang | H10H 20/8513 |
| 2024/0172515 | A1 * | 5/2024 | Kim | H10K 59/38 |
| 2024/0363811 | A1 * | 10/2024 | Li | C09K 11/02 |
| 2025/0372583 | A1 * | 12/2025 | Zhang | F21K 9/00 |

* cited by examiner

LIGHT EMITTING DEVICE AND AMBIENT LIGHT ADJUSTING DEVICE

TECHNICAL FIELD

The disclosure relates to a lighting technical field, in particular to a light emitting device.

BACKGROUND

With applications of intelligent lamps to home lighting. People not only require dimming the luminance, but also pursue dimming the color temperature of the white light and tuning ambient light which is also called tuning the color chromaticity.

Since a good chromaticity tunable function means a wide color gamut which requires the R\G\B light beam participating in the light adjustment has a narrower FWHM (Full Width Half Maximum) and suitable luminance. But for the dimming of the color temperature, it is hoped that at least two white lights with different color temperatures participating in color temperature dimming will have a better continuous spectrum which required that the FWHM of each light beam mixed into the white light should not be too narrow. Therefore, in order to realize the above tuning and dimming function, the existing lamps usually use at least five different components to independently complete the color tuning and dimming.

SUMMARY

This disclosure provides a different solution, it provides a light emitting device, which can dim the color temperature and tune ambient light only by four different light emitting units.

In one aspect, an embodiment of the disclosure provides a light emitting device which includes a red light emitting unit, a green light emitting unit, a blue light emitting unit, and a white light emitting unit. The red light emitting unit includes a first blue light emitting chip and a red fluorescent material, and a dominant wavelength of a light emitted by the red light emitting unit is in a range of 610 nanometers (nm) to 635 nm.

In another aspect, another embodiment of the disclosure provides a light emitting device including a red light emitting unit, a green light emitting unit, and a blue light emitting unit. The green light emitting unit includes a third blue light emitting chip and a narrow-wavelength green fluorescent material, and a dominant wavelength of a light emitted by the green light emitting unit is in a range of 535 nm to 550 nm.

In a still another aspect, a still another embodiment of the disclosure provides a light emitting device including a red light emitting unit, a green light emitting unit, and a blue light emitting unit. The red light emitting unit includes a first blue light emitting chip and a red fluorescent material, and a dominant wavelength of a light emitted by the red light emitting unit is in a range of 610 nm to 635 nm.

The above technical solution can have one or more of the following advantages or beneficial effects: the light emitting device is designed with a structure including a red light emitting unit, a blue light emitting unit, a green light emitting unit and a white light emitting unit; by designing the structure of the red light emitting unit, the light emitting device can tune ambient light and dim color temperature by the four light emitting units to reduce cost. In addition, on the basis of the disclosure, an ambient light adjusting device with low cost and high brightness can be realized by removing the white light emitting unit.

BRIEF DESCRIPTION OF DRAWINGS

In order to more clearly explain the technical solution of the disclosure, the following will briefly describe attached drawings needed in the description of the embodiments. Apparently, the attached drawings in the following description are only some of the embodiments of the disclosure. For those skilled in the art, other drawings can be obtained from these attached drawings without paying creative works.

DETAILED DESCRIPTION OF EMBODIMENTS

The following will clearly and completely describe technical solutions in the embodiments of the disclosure with reference to the attached drawings in the embodiments of the disclosure. Apparently, the described embodiments are only some of the embodiments of the disclosure, not all of them. Based on the embodiments of the disclosure, all other embodiments obtained by those skilled in the art without creative works should belong to the scope of protection of the disclosure.

Figure 1:
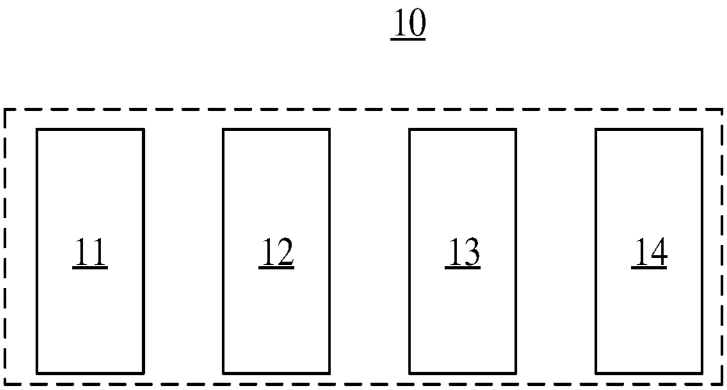
FIG. 1 is a schematic structural diagram of a light emitting device provided by an embodiment of the disclosure.

As shown in FIG. 1, the disclosure provides a light emitting device 10. The light emitting device 10 is one selected from a group consisting of an RGBW lamp, a chip on board (COB) light source or Surface Mounted Devices (SMD), and the light emitting device 10 has tuning and dimming functions such as tuning ambient light and diming color temperature. Specifically, the light emitting device 10 includes a red light emitting unit 11 (R), a blue light emitting unit 12 (B), a green light emitting unit 13 (G), and a white light emitting unit 14 (W). It can be understood that the four light emitting units mentioned above are controlled by independent circuits, that is, the four light emitting units are lit by different control circuits.

Specifically, the green light emitting unit 13 emits a green light. Furthermore, the green light emitting unit 13 includes at least one green chip (not shown in attached drawings), and a dominant wavelength of the green chip is in a range of 515 nm to 535 nm.

According to the latest research progress, it is found that the green light emitting unit 13 can further include at least one third blue light emitting chip and a narrow-wavelength green phosphor, where the narrow-wavelength green phosphor is a phosphor with a FWHM less than 70 nm and emitting a green light after being excited. By selecting the third blue light emitting chip and the green phosphor, a dominant wavelength of a light emitted by the green light emitting unit is in a range of 535 nm to 550 nm. The specific selection will be detailed in other embodiments hereinafter.

The blue light emitting unit 12 emits a blue light. Specifically, the blue light emitting unit 12 includes at least one blue chip (not shown in attached drawings), and a dominant wavelength of the blue chip is in a range of 460 nm to 475 nm. According to the latest research progress, it is found that the blue chip with the dominant wavelength between 455 nm and 460 nm, for example, the blue chip with the dominant wavelength of 475.5 nm, can also be used in the blue light emitting unit 12. That is to say, the blue light emitting unit can include at least one blue chip, and the dominant wavelength of the at least one blue chip can be in a range of 455 nm to 475 nm.

The red light emitting unit 11 includes a first blue light emitting chip and a red fluorescent material. Here, the red fluorescent material is a fluorescent material that emits a red light after being excited. Specifically, a dominant wavelength of the first blue chip is in a range of 445 nm to 460 nm. The red fluorescent material includes a first red phosphor and a second red phosphor. Specifically, the first red phosphor is a KSF (i.e., $K_2SiF_6:Mn^{4+}$, a tetravalent manganese fluoride) phosphor. It should be noted that the KSF phosphor itself is yellow, but it will emit a red light after being excited by a blue light, so that it is also called red phosphor. The second red phosphor is a long-wavelength nitride red phosphor. In the disclosure, the long-wavelength nitride red phosphor mainly refers to a nitride red phosphor whose peak wavelength is greater than that of the first red phosphor. In an embodiment, the long-wavelength nitride red phosphor is a nitride red phosphor which has a peak wavelength in a range of 635 nm to 660 nm. The nitride red phosphor is generally called CASN or 1113 phosphor, and a basic composition of the nitride red phosphor is CaAlSiN3:Eu. According to the latest research progress, it is found that the second red phosphor is not limited to long-wavelength nitride red phosphor, and it can be a certain amount of short-wavelength nitride red phosphor(that is, nitride red phosphor with a peak wavelength less than that of the first red phosphor, preferably a nitride red phosphor with a peak wavelength less than 635 nm) combined with long-wavelength nitride red phosphor. Therefore, according to the latest research progress, it can be better described that the nitride red phosphor is selected as the second red phosphor. Specifically, a FWHM of the KSF phosphor is very narrow and less than 30 nm in common, and has a peak. Therefore, the luminance of the KSF phosphor is high, which is conducive to tuning the ambient light. Compared with the KSF phosphor, the second red phosphor has a higher wavelength band and a wider FWHM. When spectral overlap occurs, it can be understood that an overlapped spectrum is more continuous if the FWHW is wider, and thus a light of the overlapped spectrum is closer to a natural light and has a higher color rendering index, which is conducive to dimming the color temperature. Therefore, the light emitting device 10 including the above-mentioned red light emitting unit 11, blue light emitting unit 12, green light emitting unit 13 and white light emitting unit 14 can realize the tuning of ambient light and dimming of the color temperature.

According to the latest research progress, it is found that the first red phosphor can be not only KSF phosphor, but also KGF (i.e., K2GeF6:$Mn^{4+}$) phosphor and KTF (i.e., K2TiF6:$Mn^{4+}$) phosphor. The KSF phosphor, the KGF phosphor and the KTF phosphor are all fluorosilicate materials excited by tetravalent manganese, which can be collectively called a fluoride red phosphor, and a FWHM thereof is usually less than 30 nm.

The white light emitting unit 14 includes a second blue light emitting chip with a dominant wavelength being in a range of 445 nm to 460 nm and a multicolor fluorescent material. It can be understood that the multicolor fluorescent material can convert a blue light emitted by the second blue light emitting chip into lights of other colors, and thus the lights of other colors can be mixed with the blue light of the second blue light emitting chip not absorbed by the multicolor fluorescent material to form a white light. Specifically, the multicolor fluorescent material includes a third red phosphor. Specifically, the third red phosphor is a short-wavelength red phosphor (in the disclosure, the short-wavelength red phosphor is a short-wavelength red phosphor with a peak wavelength less than 635 nm), and thus a part of the blue light emitted by the second blue light emitting chip passes through the third red phosphor to emit a red light. In addition, the multicolor fluorescent material further includes at least one of a green phosphor and a yellow-green phosphor. For example, the green phosphor such as $Lu_3Al_5O_{12}$:Ce (LuAG) and $Y_3(Ga,Al)_5O_{12}$:Ce (GaYAG); the yellow-green phosphor such as SiAlON:Eu (β-sialon), and the disclosure is not limited to these. In an embodiment, the third red phosphor used in the white light emitting unit 14 of the disclosure is a nitride red phosphor having a peak wavelength of an emission (i.e., a red light emitted by the third red phosphor) in a range of 605 nm-620 nm, the nitride red phosphor is generally called CASN or 1113 phosphor, a basic composition of the nitride red phosphor is CaAlSiN3:Eu. The nitride red phosphor can be added strontium (Sr) element to form (Sr,Ca)AlSiN3:Eu according to a selection of a wavelength, thereby to make the peak wavelength of the nitride red phosphor move to a direction of short waves. The (Sr,Ca)AlSiN3:Eu can also be called CASN or 1113 phosphor for short, and a basic composition of the (Sr,Ca)AlSiN3:Eu is CaAlSiN3:Eu, and different peak wavelengths represents different contents of the strontium element in the (Sr,Ca)AlSiN3:Eu. In an embodiment, a color temperature of the white light emitting unit 14 is in a range of 1800 Kelvin (K) to 3000K, the following embodiments only exemplified at 3000 K, it should be understood that the color temperature of the white light emitting unit 14 can be any other value. The white light emitting unit 14 includes one or more the second blue light emitting chip with a dominant wavelength being in a range of 445 nm to 460 nm.

It can be understood that the structure of the light emitting device 10 shown in FIG. 1 is just a simple illustration of the embodiment of the disclosure, the structure of the light emitting device 10 includes four light emitting units, the four light emitting units include the red light emitting unit 11, the blue light emitting unit 12, the green light emitting unit 13, and the white light emitting unit 14. Each of the four light emitting units includes at least one light emitting chip. In an embodiment of the disclosure, the light emitting device 10 can be a lamp that combines one or more groups of RGBW light emitting components, the RGBW light emitting component such as SMD (also called as emitter); and the light emitting device 10 can also be a chip on board (COB) or a lamp that combines one or more groups of RGBW chip scale packages (CSP). The four light emitting units RCBW are not limited to four independently detachable light emitting components, they can also be different parts that are fixedly combined for use in a single light emitting device, such as a single cup lamp bead or a multi-cup lamp bead. In a word, the red light emitting unit 11, the blue light emitting unit 12, the green light emitting unit 13, and the white light emitting unit 14 can be different light emitting components or different parts of the same light emitting component.

Figure 2:
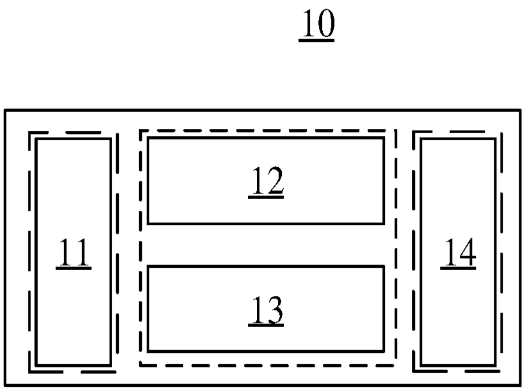
FIG. 2 is a schematic structural diagram of another light emitting device provided by an embodiment of the disclosure.

Specifically, as shown in FIG. 2, in an embodiment of the disclosure, the light emitting device 10 may include a structure consisting of three cups. One of the three cups includes the red light emitting unit 11 which includes the first blue light emitting chip and a package glue added with the long-wavelength nitride red phosphor. According to the latest research progress, it is found that the one of the three cups includes a red light emitting unit 11, which include the first blue light emitting chip and a package glue added with a fluoride red phosphor and a nitride red phosphor, where the nitride red phosphor at least includes a long-wavelength nitride red phosphor with a peak wavelength greater than that of the fluoride red phosphor. Another one of the three cups includes the white light emitting unit 14 which includes the second blue light emitting chip and a package glue added with the multicolor fluorescent material. The remaining one of the three cups includes the blue light emitting unit 12 and the green light emitting unit 13. Specifically, the blue light emitting unit 12 and the green light emitting unit 13 are not added with any phosphor, and thus this cup only needs to be added with a package glue such as a silica gel material to protect the chips. According to the latest research progress, it is found that if the green light emitting unit 13 adopts the third blue light emitting chip and narrow-wavelength green phosphor in this embodiment, the green light emitting unit 13 can be a chip-level package structure. It should be noted that each of the three cups can includes one or more light emitting chips.

Figure 3:
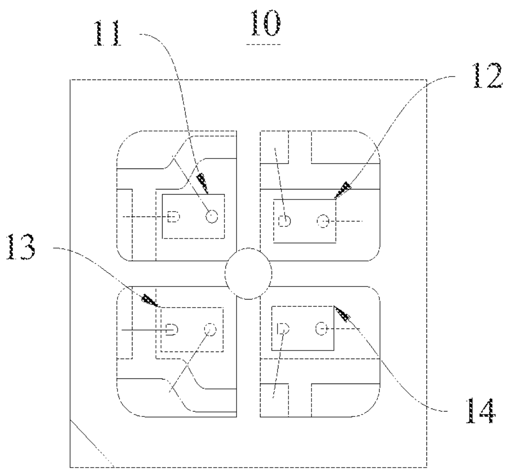
FIG. 3 is a schematic structural diagram of a still another light emitting device provided by an embodiment of the disclosure.

As shown in FIG. 3, in an embodiment of the disclosure, the light emitting device 10 includes a structure consisting of four cups. Different from the structure corresponding to FIG. 2, each of the blue light emitting unit 12 and the green light emitting unit 13 in FIG. 3 occupies one cup. Compared with the structure with three cups, the structure with the four cups make a light emitted by each of the four cups be concentrated and has a better light mixing effect, at the same time, the structure with the four cups also has a better heat dissipation effect and can maintain the stability of the thermal performance of each of the light emitting units.

Figure 5:
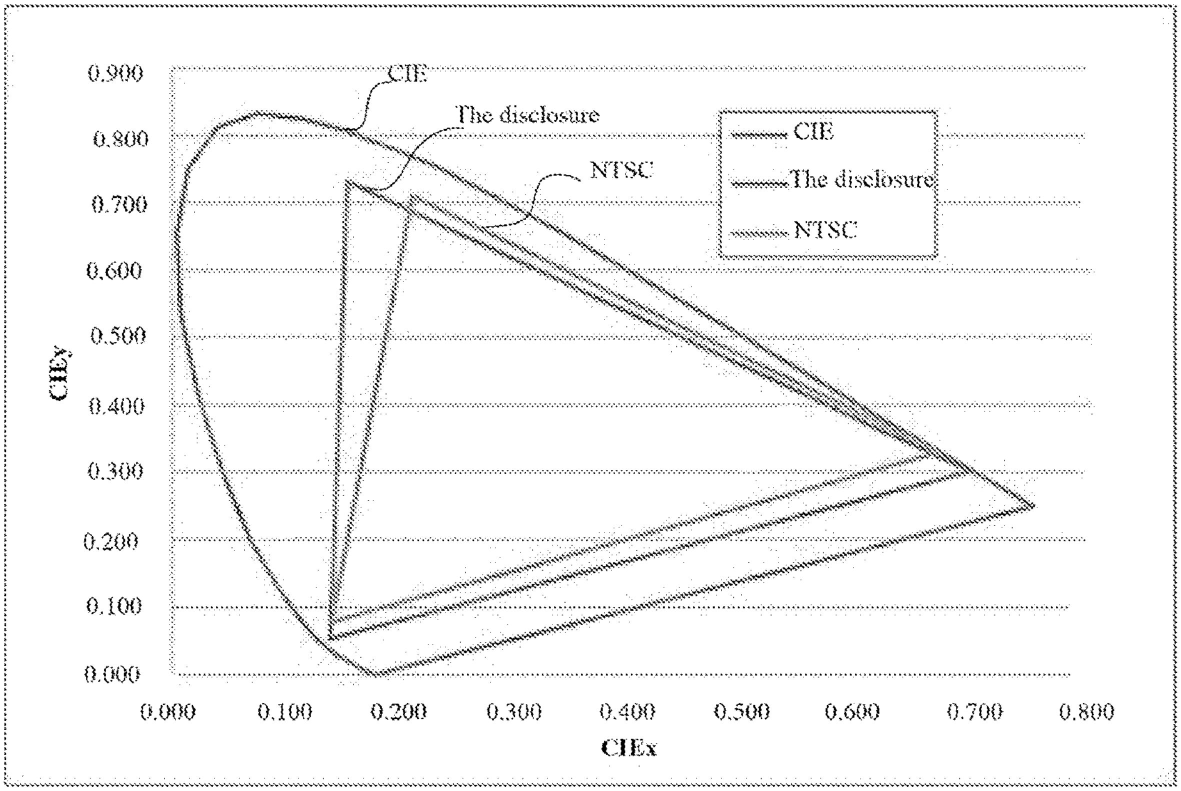
FIG. 5 is a schematic diagram of a color gamut range of a light emitting device provided by an embodiment of the disclosure.

An embodiment of the disclosure provides a light emitting device 10 which has an excellent color tuning effect of an ambient lamp. It should be noted that the higher the color richness of an ambient light, the better the color tuning effect of the ambient lamp, and the color richness of the ambient light can be evaluated by a national television standards committee (NTSC) color gamut. As shown in FIG. 5, NTSC color gamut of the light emitting device 10 provided in this embodiment of the disclosure is large than or equal to 100% NTSC, and the NTSC color gamut of the light emitting device 10 in this embodiment is 118.3% NTSC.

Specifically, TABLE 1 shows parameters of the light emitting device 10 provided by an embodiment of the disclosure, the light emitting device 10 realizes the dimming of color temperature and the tuning of ambient light by adjusting an electric current ratio of the four light emitting units:

TABLE 1

Parameter table of the light emitting device

| | mA | | | | | | |
|---|---|---|---|---|---|---|---|
| CCT | B | G | PC red | 30 C. | x | y | CRI |
| 2700K | 0 | 3 | 10 | 20 | 0.4568 | 0.4127 | 93.9 |
| 3000K | 1 | 4 | 8 | 20 | 0.4280 | 0.4016 | 95 |
| 4000K | 3 | 4 | 4 | 20 | 0.3821 | 0.3775 | 92.6 |
| 5000K | 6 | 7 | 2 | 20 | 0.3403 | 0.3493 | 91.8 |
| 5700K | 7 | 7 | 1 | 20 | 0.3289 | 0.3389 | 90.4 |
| 6500K | 9 | 8 | 0 | 20 | 0.3112 | 0.3249 | 89.3 |

In the TABLE 1, "30 C" means a color temperature of the white light emitting unit 14 being 3000K. A dimming range of the color temperature of the light emitting device 10 is in a range of 2700K to 6500K. In the dimming range of the light emitting device 10, color rendering indexes of the light emitting device 10 are 90 on average. It should be noted that the color temperature of the light emitting device 10 provided by an embodiment of the disclosure can be adjusted to be lower than 2700K or higher than 6500K, and the color temperature of the white light emitting unit 14 can be 2000K or any other color temperature value. The "x" (also referred to CIEx) and "y" (also referred to CIEy) in the TABLE 1 are chromaticity coordinate values corresponding to a color temperature in a chromaticity diagram (also referred to CIE diagram).

Specifically, when the color temperature is adjusted, there are at least three light emitting units emit lights at the same time. In addition, it can be seen in TABLE 1 that the light emitting device 10 can achieve different color temperatures by adjusting electric currents of the four light emitting units. Most of color rendering indexes (CRI) of the light emitting device 10 provided by the embodiment of the disclosure are greater than 90, i.e., the light emitting device has high color rendering indexes. The higher the color rendering indexes, the easier it is for the human eye to distinguish different colors of objects. Under the light source with poor color rendering property for a long time, the sensitivity of human eye cone cells will be reduced, which is easy to cause eye fatigue. The color rendering indexes of the embodiment of the disclosure are high, which provides a good user experience.

Figure 4:
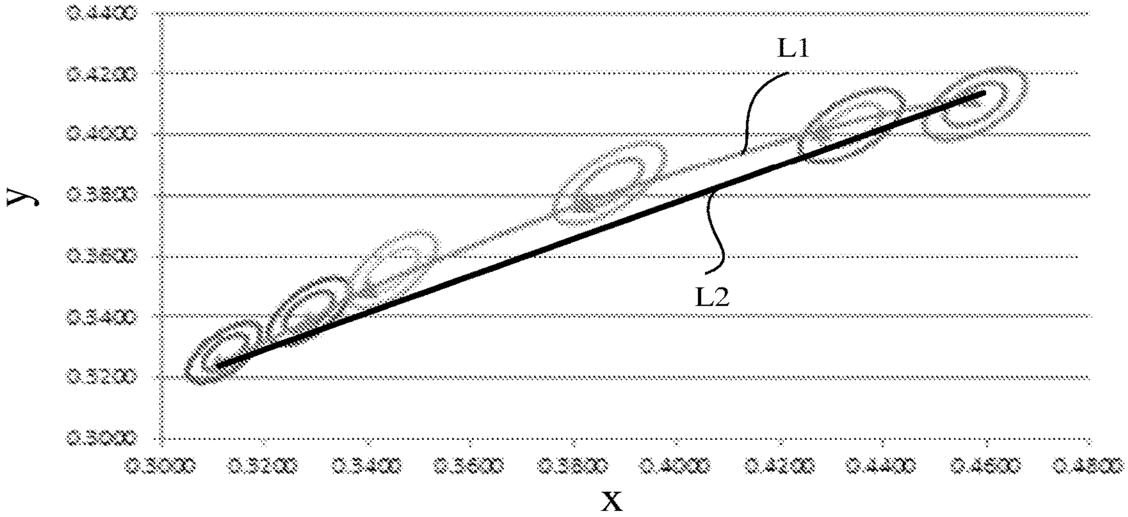
FIG. 4 is a chromaticity diagram of a light emitting device provided by an embodiment of the disclosure.

In an embodiment, as shown in FIG. 4, a light emitting curve of the color temperature device 10 is L1. The color temperature (Triangle in FIG. 4) on the L1 is located in a center of a color temperature range of American national standards institute (ANSI), that is, each the color temperature on the L1 falls between two ellipses adjacent to the color temperature, which indicates a color corresponding to the color temperature is a standard color. Therefore, the light emitting device 10 realizes the tuning of ambient light and the dimming of the color temperature. However, the prior art adopts a scheme of dimming the color temperature with a warm white light and a cold white light: for example, if a color temperature of the warm white light is 2700K and a color temperature of the cold white light is 6500K, then a light emitting curve corresponding to the scheme is a straight line L2, and thus some of color temperatures between the warm white light and the cold white light will not fall between the two ellipses, which is a large deviation from the standard color. In addition, it is necessary to ensure that the color rendering indexes of both warm white light and cold white light reach 90, so that the color rendering index of the dimming effect can reach which are high requirements for the warm white light and the cold white light.

It should be noted that the selection of electric currents will change according to sizes of chips. The parameters in TABLE 1 are only for specific adjustments and controls of the chips used in specific embodiments to verify that the light emitting device 10 of the disclosure can achieve the effect of adjusting the ambient light and the color temperature and high color rendering indexes only by four light emitting units, and the electric current ratio of the light emitting device 10 is not intended to limit the technical scope of the disclosure. In a more general and applicable way, the regulation of each of the light emitting units of the light emitting device 10 of the disclosure is shown by luminance ratios of the light emitting units. The luminance 100 lm of the white light unit 14 is taken as a reference, TABLE 2 shows parameters of the light emitting device 10 provided by an embodiment of the disclosure, which realizes the dimming of color temperature and the tuning of ambient light by adjusting the luminance ratios of the four light emitting units:

TABLE 2

Parameter table of color temperature and lumen parameters of four light emitting units in the light emitting device

| | lm | | | |
|---|---|---|---|---|
| CCT | B | G | PC red | 30C |
| 2700K | 0.0 | 8.9 | 10.7 | 100 |
| 3000K | 0.6 | 11.9 | 8.6 | 100 |
| 4000K | 1.8 | 11.9 | 4.3 | 100 |
| 5000K | 3.6 | 20.8 | 2.1 | 100 |
| 5700K | 4.2 | 20.8 | 1.1 | 100 |
| 6500K | 5.4 | 23.8 | 0.0 | 100 |

In the TABLE 2, "30 C" means a color temperature of the white light emitting unit 14 being 3000K. "lm" is a physical unit called lumen which is used to describe the luminous flux, and the lumen represents a total amount of visible light emitted by a light source in a unit time. When the color temperature of the light emitting device 10 is 2700K, at the same time, a luminous flux of a red light emitted by the red light emitting unit 11 is 10.7 lumens, a luminous flux of a green light emitted by the green light emitting unit 13 is 8.9 lumens, a luminous flux of a blue light emitted by the blue light emitting unit 12 is 0 lumens, and a luminous flux of a white light emitted by the white light emitting unit 14 is 100 lumens. It should be noted that each specific value in the TABLE 2 have a tolerance (i.e., changing range) of ±50%. Although TABLE 2 only shows that the color temperature of the light emitting device 10 changes from 2700K to 6500K, the color temperature of the light emitting device 10 provided by other embodiments of the disclosure can be adjusted to be lower than 2700K or higher than 6500K, and the color temperature of the white light emitting unit can be 2000K or any other color temperature value.

Therefore, the luminance of a red light emitted by the red light emitting unit 11 in the light emitting device 10 participating in mixing light decreases with the increase of color temperature. The luminance of a green light emitted by the green light emitting unit 13 participating in mixing light in the light emitting device 10 increases with the increase of the color temperature. The brightness of a blue light emitted by the blue light emitting unit 12 participating in the mixing light in the light emitting device 10 increases with the increase of the color temperature. It should be noted that "30 C" refers to a color temperature of the white light emitting unit 14 is 3000K. It can be understood that although TABLE 1 and TABLE 2 only show that the color temperature of the light emitting device 10 changes from 2700K to 6500K, the color temperature of the light emitting device 10 provided by other embodiments of the disclosure can be adjusted to be lower than 2700K or higher than 6500K, and the color temperature of the white light emitting unit 14 can be 2000K or any other color temperature value.

Figure 6:
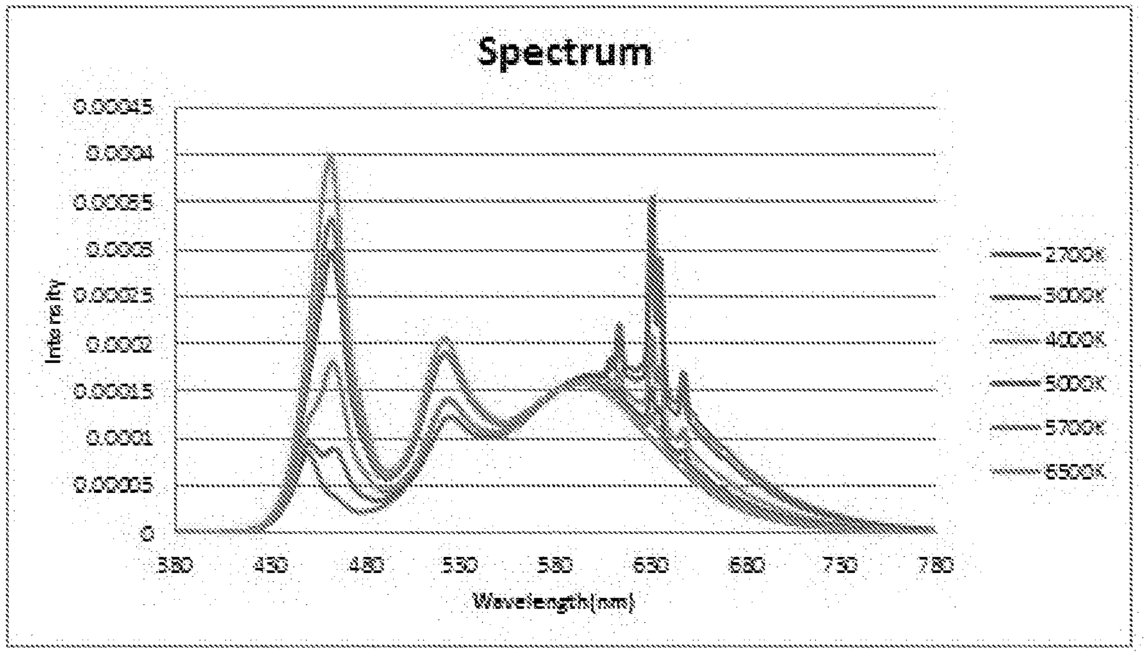
FIG. 6 is a schematic diagram of a spectrum of a light emitting device provided by an embodiment of the disclosure.

As shown in FIG. 6, an emission spectrum of the light emitting device 10 has a first peak, a second peak, and a third peak. Among them, the first peak is located in a wavelength of 615 nm to 635 nm, that is, the first peak is located in a wavelength where the light emitting device 10 emits a red light. The second peak is located in a wavelength of 460 nm to 475 nm, that is, the second peak is located in a wavelength where the light emitting device 10 emits a blue light. The third peak is located in a wavelength of 515 nm to 535 nm, that is, the third peak is located in a wavelength where the light emitting device 10 emits a green light. With the increase of the color temperature of the light emitting device 10, a FWHM corresponding to the second peak increases with the increase of the color temperature. The intensity of the third peak increases with the increase of the color temperature, and the intensity of the first peak decreases with the increase of the color temperature.

In an embodiment of the disclosure, the red light emitting unit 11 uses the technical solution of combining a blue light emitting chip with multiple red phosphors to emit a specific red light, the technical solution can not only replace a traditional red chip to participate in the adjustment of color lights, but also participate in the adjustment of the color temperature of a white light. More importantly, it can make a color rendering index of a final light reach about 90 without requiring that all the color lights participating in the adjustment of the color temperature have high color rendering indexes. Specifically, by adjusting a mass ratio between the first red phosphor and the second red phosphor, the red light emitting unit 11 can emit a red light with a dominant wavelength in a range of 615 nm to 635 nm. According to the latest research progress, it is found that by adjusting the mass ratio of the first red phosphor to the second red phosphor, the red light emitting unit 11 can emit a red light with the dominant wavelength in a range of 610 nm to 615 nm, which is also suitable for the light emitting device of the disclosure. Under the excitation of a blue light emitted by the first blue light emitting chip, the KSF phosphor converts a part of the blue light into a narrow-wavelength red light with a peak wavelength in a range of 630 nm to 634 nm, and the long-wavelength nitride red phosphor also converts a part of the blue light into a wide-wavelength red light with a peak wavelength in a range of 635 nm to 660 nm. Among them, the KSF phosphor has a narrow FWHM (FWHM is considered to be narrow if it is less than 30 nm), and thus the spectrum of the red light emitting unit 11 has a narrow peak.

Since the color purity of the red light excited by the KSF phosphor is high, it is easy to adjust the light. The nitride red phosphor has good absorption characteristics to the blue light, and thus the long-wavelength nitride red phosphor can continue to convert and absorb the blue light emitted by the first blue light emitting chip while not absorbed by the KSF phosphor, thus reducing the impact of the blue light emitted by the first blue light emitting chip on the color purity of the red light emitted by the red light emitting unit 11. According to the latest research progress, it is found that the KSF red phosphor can be replaced by a nitride red phosphor such as KGF and KTF, and a short-wavelength nitride phosphor can be used together with long-wavelength nitride red phosphor to reduce the absorption of a narrow-wavelength red light by the long-wavelength nitride phosphor and improve the brightness of the whole red light emitting unit 11.

Figure 7:
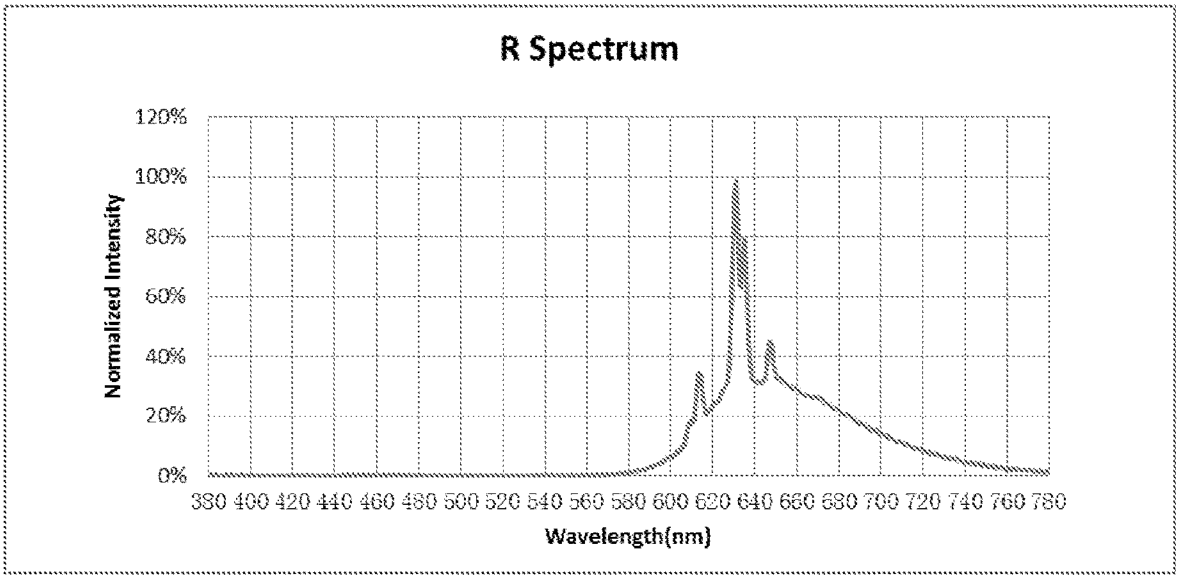
FIG. 7 is a schematic diagram of a spectrum of a red light emitting unit in a light emitting device provided by an embodiment of the disclosure.

As shown in FIG. 7, in a diagram of an emission spectrum of the red light emitting unit 11, the emission spectrum of the red light emitting unit 11 has a first peak located in a wavelength of 615 nm to 635 nm. According to the latest research progress, it is found that the emission spectrum of the red light emitting unit 11 can have the first peak in a wavelength of 610 nm to 635 nm. The intensity corresponding to the first peak is 100% in FIG. 7. The intensity of the red light emitting unit 11 in a nanometer wavelength (i.e., a range of a dominant wavelength of a light emitted by the first blue light emitting chip) is less than or equal to 10% of the intensity corresponding to the first peak. It can be seen that although the red phosphor of the red light emitting unit is excited by the first blue light emitting chip to emit a red light, the red light emitted by the red light emitting unit 11 has high color purity and luminance. Furthermore, as shown in FIG. 7, in an embodiment of the disclosure, the intensity of the red light emitting unit 11 in a wavelength of 660 nm is in a range of 15% to 40% of the intensity corresponding to the first peak. It should be noted that when the intensity of the red light emitting unit 11 in the wavelength of 660 nm is less than 15% of the intensity corresponding to the first peak or more than 40% of the intensity corresponding to the first peak, it means that the light emitted by the first blue light emitting chip is not fully absorbed and converted, or is excessively absorbed and converted by the long-wave nitride red phosphor, therefore resulting in a poor luminance effect. Of course, it can be understood that in an embodiment of the disclosure, the peak wavelength of the long-wavelength nitride red phosphor used is in a range of 635 nm to 660 nm, for example, 650 nm, and the emission spectrum of the red light emitting unit 11 with the peak wavelength of 650 nm still has the above characteristics as it has a peak wavelength of 660 nm. Since mutual interferences of emission spectrums of different phosphors, it is not easy to measure the intensity of the red light emitting unit 11 with the peak wavelength of 650 nm. Therefore, the parameters of the red light emitting unit 11 measured at a wavelength of 660 nm are taken as a standard in the embodiments of the disclosure.

Since the red phosphors are used in the red light emitting unit 11 and the white light emitting unit 14 to emit red lights. Therefore, in order to avoid the mutual interference of the red lights of the red light emitting unit 11 and the white light emitting unit 14 affecting the tuning of ambient light and the dimming of color temperature of the light emitting device 10, the color rendering index of the white light emitting unit 14 does not need to be too high. If the color rendering index of the white light emitting unit 14 is high, the spectrum of the red light emitted by the third red phosphor in the white light emitting unit 14 may excessively overlap with the spectrum of the red light emitted by the red light emitting unit 11, which makes the overlapped spectrum fail to meet the requirements of tuning ambient light and dimming color temperature. Therefore, it is recommended that the color rendering index of the white light emitting unit 14 is less than or equal to 80. The FWHM of the white light emitted by the white light emitting unit 14 is less than or equal to 110 nm. Specifically, in an embodiment, the color rendering index of the white light emitting unit 14 is suggested to be about 70. Therefore, it can be understood that although the color rendering index of the white light emitting unit 14 is low, the color rendering index of the light emitting device 10 can also be high.

In an embodiment of the disclosure, the light emitting device 10 is designed with a structure including the red light emitting unit 11, the blue light emitting unit 12, the green light emitting unit 13 and the white light emitting unit 14, and the red light emitting unit 11 includes the KSF phosphor with a very narrow FWHM and a peak, the long-wavelength nitride red phosphor which can absorb the blue light, and the first blue light emitting chip. Therefore, the tuning of ambient light and dimming of color temperature can be realized by the four light emitting units, which reduces the cost. In addition, the light emitting device 10 provided by the embodiment further has a beneficial effect that although the color rendering index of the white light emitting unit 14 is low, the color rendering index of the light emitting device 10 is high.

It is particularly important to mention that although the above embodiments of the disclosure are introduced with a light emitting device including four different light emitting units. However, those skilled in the art can remove the white light emitting unit on the basis of the disclosure, as such, an ambient light adjusting device with low cost and high brightness can be realized. The following embodiments, according to the latest research progress, introduce some research progress of the red light emitting unit and the green light emitting unit, taking the ambient light adjusting device including red light emitting unit, the blue light emitting unit, and the green light emitting unit as an example.

Figure 8:
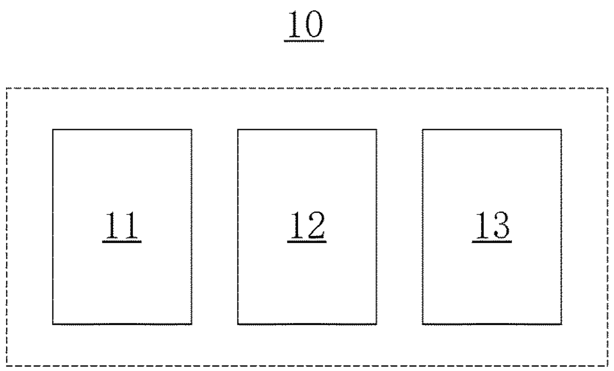
FIG. 8 is a schematic structural diagram of a yet still another light emitting device provided by an embodiment of the disclosure.

Referring to FIG. 8, an embodiment of the disclosure also provides a yet still another light emitting device 10, which may include, for example, a red light emitting unit 11 (R), a blue light emitting unit 12 (B) and a green light emitting unit 13 (G). It can be understood that the three light emitting units mentioned above are controlled by independent circuits, that is, the four light emitting units are lit by different control circuits.

Specifically, the blue light emitting unit 12 emits a blue light. Furthermore, the blue light emitting unit 12 includes at least one blue chip (not shown in the attached drawings), and a dominate wavelength of the blue chip is in a range of 455 nm to 475 nm.

Figure 9:
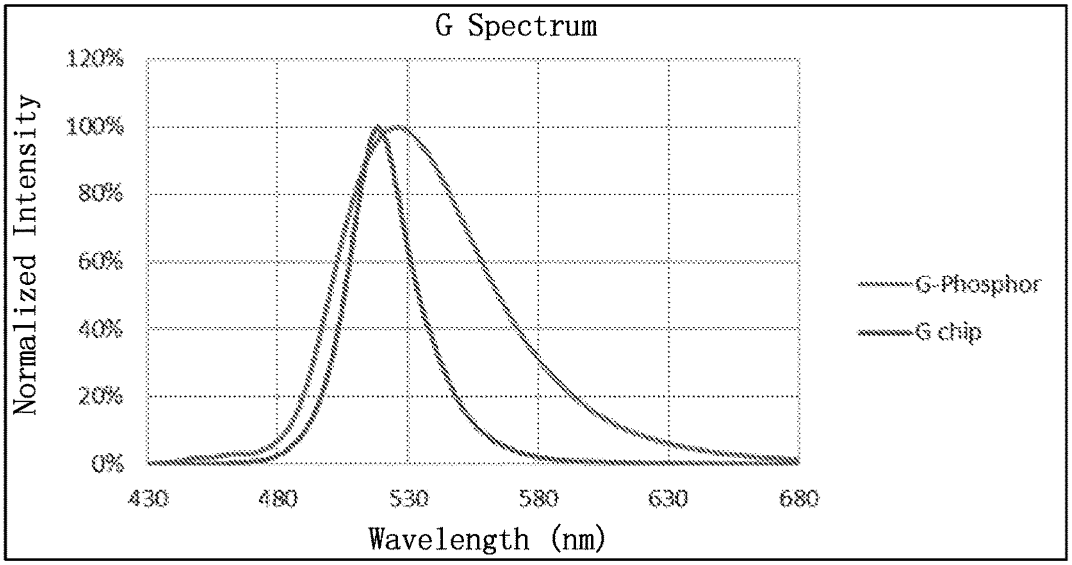
FIG. 9 is a schematic diagram of a spectrum of a green light emitting unit in a light emitting device provided by an embodiment of the disclosure.

In a specific implementation of this embodiment, the green light emitting unit 12 may include, for example, a third blue light emitting chip and a narrow-wavelength green phosphor. Referring to FIG. 9, a peak wavelength of a light emitted by the green light emitting unit 12 is in a range of 520 nm to and 530 nm, and a FWHM of the light is in a range of 60 nm to 70 nm, and a corresponding dominant wavelength is in a range of 535 nm to 550 nm. Specifically, a wavelength of the third blue light emitting chip is in a range of 440 nm to 455 nm. The narrow-wavelength green phosphor can be, for example, one or more selected from the group consisting of a silicate phosphor, a NBG phosphor and a β-sialon phosphor. In an illustrated embodiment, the narrow-band green phosphor is (Ba,Sr)2SiO4:Eu phosphor.

By adjusting the amounts of Ba and Sr in the $(Ba,Sr)_2SiO_4$:Eu phosphor, the FWHM of the green light emitting unit 12 can be in a range of 60 nm to 70 nm. Considering a conversion efficiency of $(Ba,Sr)_2SiO_4$:Eu phosphor, the wavelength of the third blue light emitting chip is selected to be in a range of 440 nm to 455 nm. Therefore, because of the shorter wavelength of the third blue light emitting chip, the conversion efficiency is improved, the corresponding brightness is also higher, and the amount of usage of the $(Ba,Sr)_2SiO_4$:Eu phosphor is also reduced.

In the related art, a green light emitting chip is usually selected to be the green light emitting unit. A wavelength of a commonly used green light emitting chip is in a range of 515 nm to 530 nm, chromaticity coordinate values x and y corresponding to the dominate wavelength of 520 nm are about 0.14 and 0.705, respectively, chromaticity coordinate values x and y corresponding to the dominate wavelength of 523 nm are about 0.15 and 0.727, respectively, and chromaticity coordinate values x and y corresponding to the dominate wavelength of 515 nm to 530 nm are about 0.12 to 0.17, and 0.68 to 0.75, respectively. A color purity of a green light emitted by the commonly used green light emitting chip is about 74%. In order to ensure the color consistency of the green light, it is usually necessary to choose a green chip with a wavelength of 5 nm, which will lead to higher cost.

In this embodiment, the green light emitting unit 12 is set to include the third blue light emitting chip and the narrow-wavelength green phosphor, Due to the selection of the green phosphor, the dominate wavelength of the emitted light is in a range of 535 nm to 550 nm, x is in a range of 0.25 to 0.3, and y is in a range of 0.6 to 0.63. Compared with the solution using the green light emitting chip, a corresponding NTSC color gamut is decreased, and it is about 86%. However, from the perspective of color tuning of the RGB ambient light, sacrificing a certain NTSC color gamut can improve the color consistency of green light and reduce the cost of chip selection, and the color gamut value is still 86%, which is still a very market choice.

It is worth mentioning that the way that the green light emitting unit 12 is arranged to include the third blue light emitting chip and the narrow-wavelength green phosphor is not only suitable for a RGB light emitting device, but also suitable for RGBW light emitting device as shown in FIG. 1.

Figure 10:
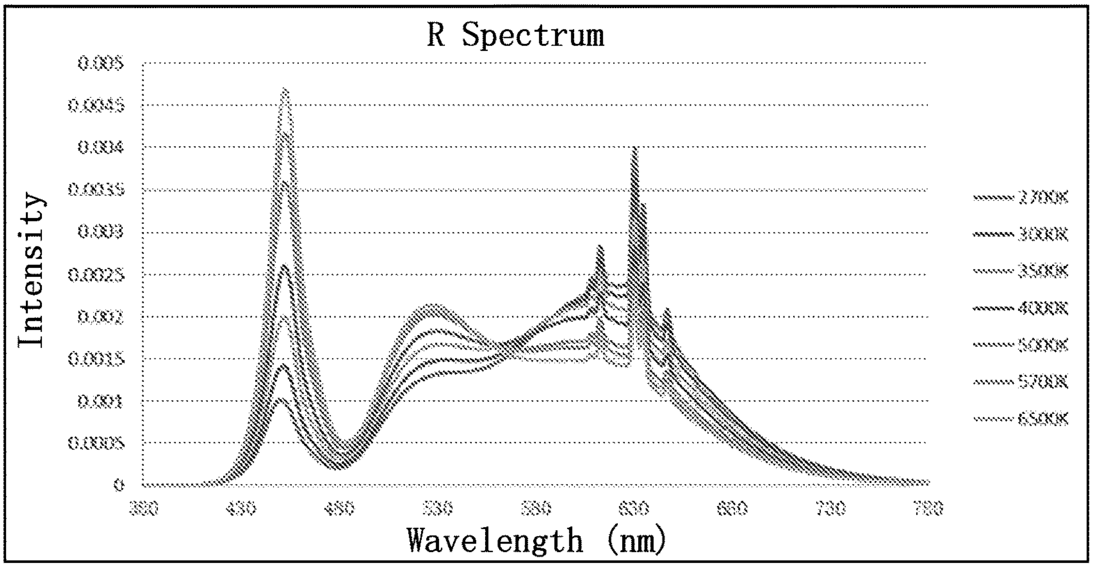
FIG. 10 is another chromaticity diagram of a light emitting device provided by an embodiment of the disclosure.
Figure 11:
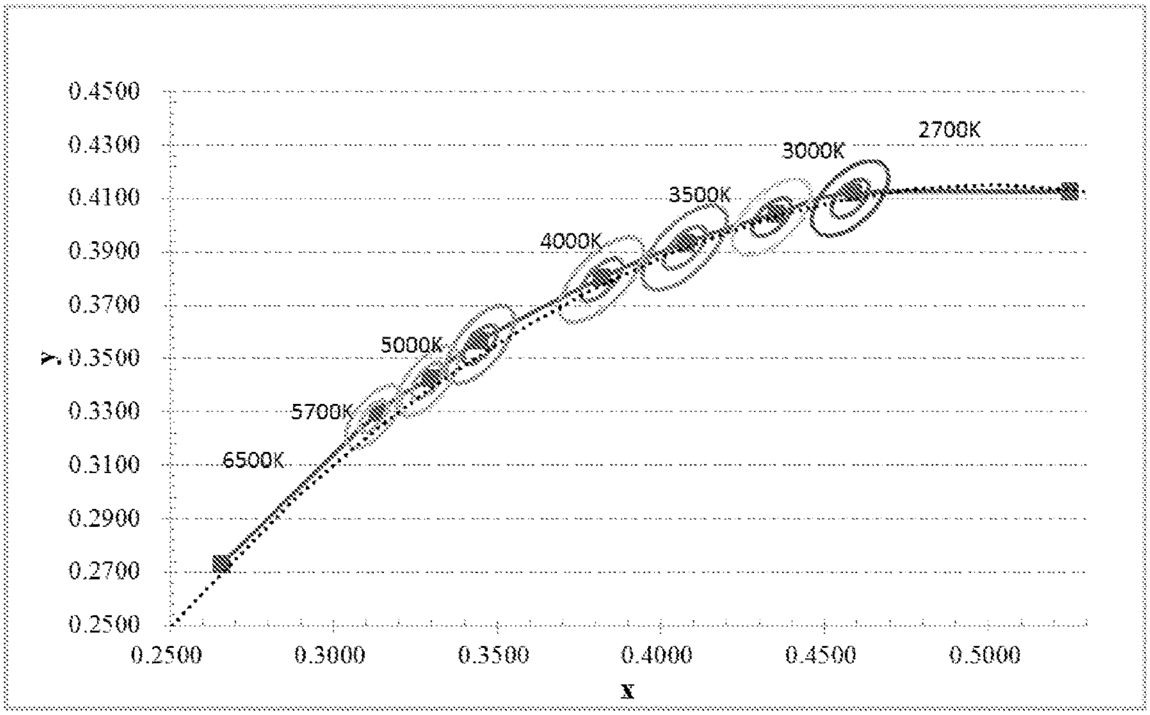
FIG. 11 is schematic diagram of another spectrum of a light emitting device provided by an embodiment of the disclosure.

In the RGBW light emitting device, the green light emitting unit 12 is arranged to include the third blue light emitting chip and the narrow-wavelength green phosphor. In an illustrated embodiment, a color temperature of the white light emitting unit 14 is 2500K; the color rendering index CRI is less than 80, for example, the color rendering index CRI is about 70; the FWHM is less than 110 nm; the peak wavelength is about 600 nm; and a color point center CIExy is (0.487, 0.432). Referring to FIG. 10 and FIG. 11, from the perspective of the RGBW light emitting device, by setting the green light emitting unit 12 to include the third blue light emitting chip and the narrow-wavelength green phosphor, the color consistency of the green light can be ensured, the light efficiency can be improved, and the requirements of customers with high light efficiency can be met. Further, the white light spectrum can be more continuous.

In a specific implementation of this embodiment, the red light emitting unit 11 may, for example, include a first blue light emitting chip and a red phosphor, and the dominate wavelength of the light emitted by the red light emitting unit 11 may, for example, be in a range of 610 nm to 635 nm. With this arrangement, the brightness of the light emitted by the red light emitting unit 11 can be improved, and the purity of the light emitted by the red light emitting unit 11 is greater than or equal to 0.96. It is worth mentioning that the red light emitting unit 11 in this embodiment is suitable not only for the RGB light emitting device, but also for the RGBW light emitting device as shown in FIG. 1.

Figure 12:
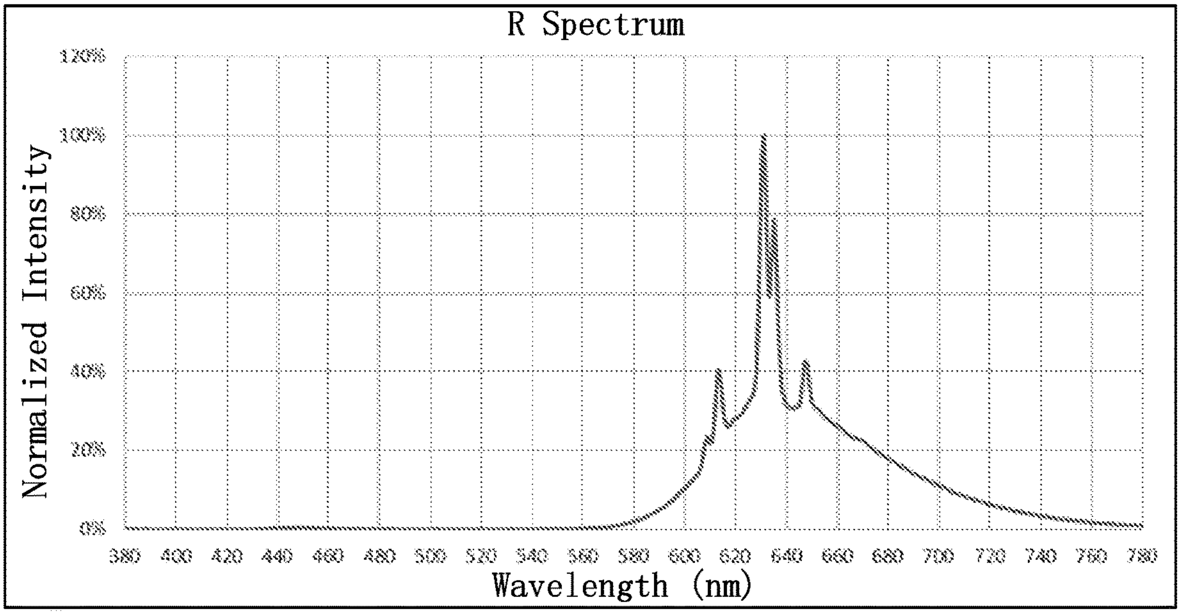
FIG. 12 is a schematic diagram of a spectrum of another red light emitting unit in a light emitting device provided by an embodiment of the disclosure.

Specifically, referring to FIG. 12, when the dominate wavelength of the light emitted by the red light emitting unit 11 is required to be in a range of 610 nm to 625 nm, a solution for improving the brightness of the red light emitting unit 11 is that the red phosphor may include for example a first red phosphor and a second red phosphor. Specifically, the first red phosphor may be a fluoride red phosphor, and the second red phosphor may be a nitride red phosphor, which in turn includes a long-wavelength nitride red phosphor and a short-wavelength nitride red phosphor. Among them, the long-wavelength nitride red phosphor is a nitride red phosphor with a peak wavelength greater than that of the first red phosphor, such as $CaAlSiN_3$:Eu or $(Sr,Ca)AlSiN_3$:Eu with a peak wavelength between 635 nm and 660 nm; and the short-wavelength nitride red phosphor is a nitride red phosphor with a peak wavelength less than that of the first red phosphor, for example, $(Sr,Ca)AlSiN_3$:Eu with a peak wavelength less than 635 nm.

The use of the long-wavelength nitride red phosphor is to shift the dominate wavelength of the red light emitting unit to a long-wavelength direction compared with the peak wavelength of the fluoride phosphor, so that the dominate wavelength of the red light emitting unit can meet the requirements of high color gamut. However, the long-wavelength nitride red phosphor will also absorb the light converted from the fluoride red phosphor to a certain extent, resulting in a decrease in brightness. The greater the amount of usage of the long-wavelength nitride red phosphor, the more obvious the decrease in brightness. If the amount of nitride red phosphor is insufficient, it will not be enough to absorb the excess blue light not absorbed by the fluoride red phosphor in the first blue light emitting chip, and the purity of the light emitted by the red light emitting unit 11 cannot be guaranteed. Therefore, when the dominate wavelength of the light emitted by the red light emitting unit 11 is in a range of 610 nm to 625 nm, a certain amount of the short-wavelength nitride red phosphor can be used in combination with the long-wavelength nitride red phosphor, and a wavelength difference between the long-wavelength nitride red phosphor and the short-wavelength nitride red phosphor can be for example greater than 10 nm. Because two kinds of nitride red phosphors with different peak wavelengths are used, the red light spectrum will be relatively symmetrical. By adjusting a ratio of long-wavelength nitride red phosphor to the short-wavelength nitride red phosphor, a ratio of an intensity of the red light spectrum emitted by the red light emitting unit 11 in a wavelength of 700 nm to an intensity of the red light spectrum emitted by the red light emitting unit 11 in a wavelength of 600 nm is less than or equal to 110%. TABLE 3 shows relevant parameters corresponding to implementations with different proportions of long-wavelength nitride red phosphor and short-wavelength nitride red phosphor. It can be clearly seen that the brightness of the light emitted by the red light emitting unit 11 can be improved and the purity of the light emitted by the red light emitting unit 11 is greater than or equal to 0.96.

TABLE 3

Relevant parameters corresponding to implementations with different proportions of long-wavelength nitride red phosphor and short-wavelength nitride red phosphor

| Nitride red phosphor | Flux | lm % | X | Y | WD | Blue light ratio | Purity |
|---|---|---|---|---|---|---|---|
| 640 | 13.35 | 100.0% | 0.6628 | 0.3162 | 616.9 | 0.61% | 0.938 |
| 640 | 11.62 | 87.0% | 0.6776 | 0.3127 | 618.2 | 0.14% | 0.971 |
| 640 + 620 (1:0.2) | 13.87 | 103.9% | 0.6737 | 0.3174 | 616.1 | 0.30% | 0.974 |
| 640 + 628 (1:0.2) | 13.64 | 102.1% | 0.6750 | 0.3154 | 617.0 | 0.27% | 0.972 |
| 640 + 628 (1:0.1) | 12.21 | 91.5% | 0.6785 | 0.3139 | 617.6 | 0.20% | 0.978 |
| 650 + 620 (1:0.5) | 14.96 | 112.0% | 0.6739 | 0.3163 | 616.6 | 0.24% | 0.971 |
| 650 + 628 (1:0.5) | 15.20 | 113.8% | 0.6769 | 0.3138 | 617.7 | 0.25% | 0.973 |

Figure 13:
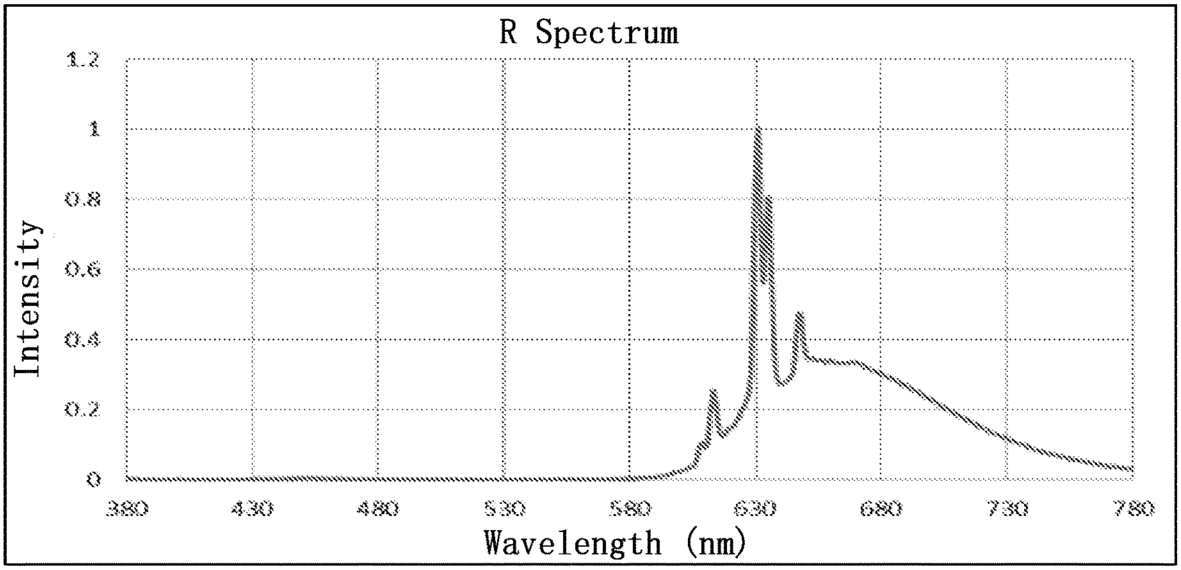
FIG. 13 is a schematic diagram of a spectrum of a still another red light emitting unit in a light emitting device provided by an embodiment of the disclosure.

Referring to FIG. 13, when the dominate wavelength of the light emitted by the red light emitting unit 11 is required to be in a range of 625 nm to 635 nm, the red phosphor may include, for example, a first red phosphor, which may be a fluoride red phosphor, and a second red phosphor, which may be, for example, one or more nitride red phosphors with a wavelength greater than 635 nm. Because the longer the wavelength of the nitride red phosphor is, the farther away from a visual function, the lower the brightness, so an intensity of a normalized spectrum at 660 nm is less than or equal to 40%.

Figure 14A:
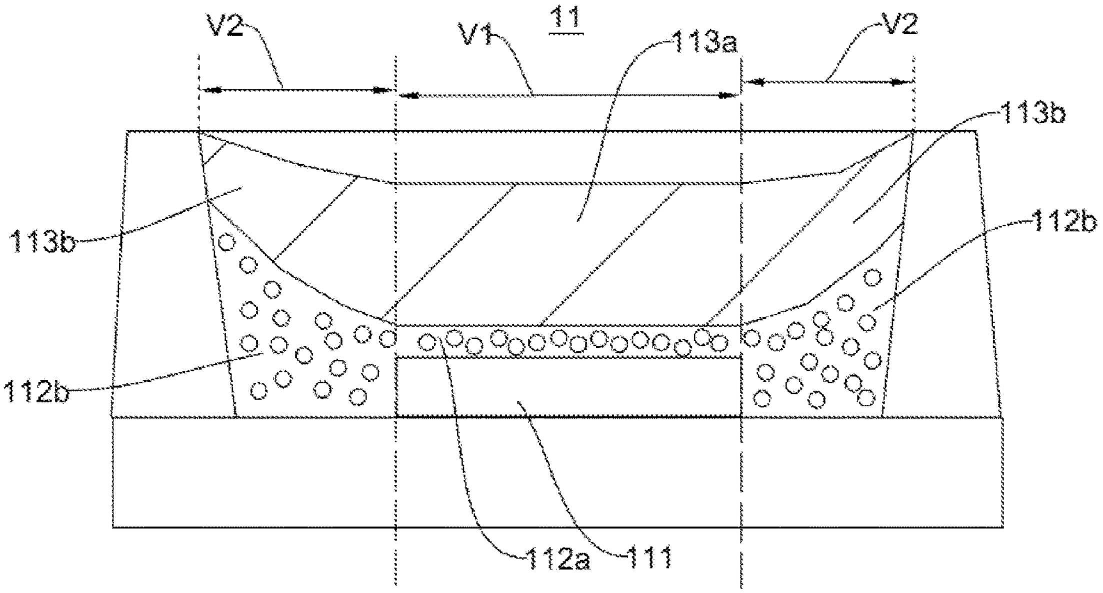
FIGS. 14A-14B are schematic sectional views of red light emitting units in a light emitting device provided by an embodiment of the disclosure.

In order to improve the luminous brightness of the red light emitting unit 11, it can be made by, for example, a layered dispensing process. Specifically, referring to FIG. 14A, a red light emitting unit 11 is defined as an upper region V1 located above a first blue light emitting chip 111 and a peripheral region V2 surrounding the first blue light emitting chip 111 and the upper region V1. A first red phosphor and a second red phosphor are respectively dispersed in silica gel to form a first red fluorescent adhesive layer and a second red fluorescent adhesive layer, where the first red fluorescent adhesive layer covers, for example, the upper part and the periphery of the first blue light emitting chip 111, and the second red fluorescent adhesive layer covers the first red fluorescent adhesive layer. Specifically, for example, a first red fluorescent adhesive layer 112*a* is formed in the upper region V1, and a first red fluorescent adhesive layer 112*b* is formed in the peripheral region V2. A second red fluorescent adhesive layer 113*a* is formed in the upper region V1, and a second red fluorescent adhesive layer 113*b* is formed in the peripheral region V2.

In particular, for the red light emitting unit 11 whose dominate wavelength is required to be in a range of 625 nm and 635 nm, a mass ratio of the first red phosphor to the second red phosphor is different in the upper region V1 from that in the peripheral region V2 in order to reduce the absorption of the nitride red phosphor to the light emitted by fluoride red phosphor and further improve the brightness. Based on the uniformity of each layer of fluorescent glue in the dispensing process, it can be approximately considered that the volume ratio or cross-sectional thickness (average thickness or median thickness) ratio of the first red fluorescent adhesive layer 112 *a* or 112*b* and the second red fluorescent adhesive layer 113 *a* or 113*b* is different in the upper region V1 from that in the peripheral region V2. Based on the control of the concentration of the dispensing process, the above characteristics are usually intuitively reflected in that the thickness (average thickness or median thickness) of the first red fluorescent adhesive layer is greater than that of the second red fluorescent adhesive layer in the upper region V1 or the peripheral region V2. For example, referring to FIG. 14A, in the upper region V1, the thickness of the first red fluorescent adhesive layer 112*a* is smaller than that of the second red fluorescent adhesive layer 113*a*, and in the peripheral region V2, the thickness of the first red fluorescent adhesive layer 112*a* is greater than that of the second red fluorescent adhesive layer 113*a*.

Figure 14B:
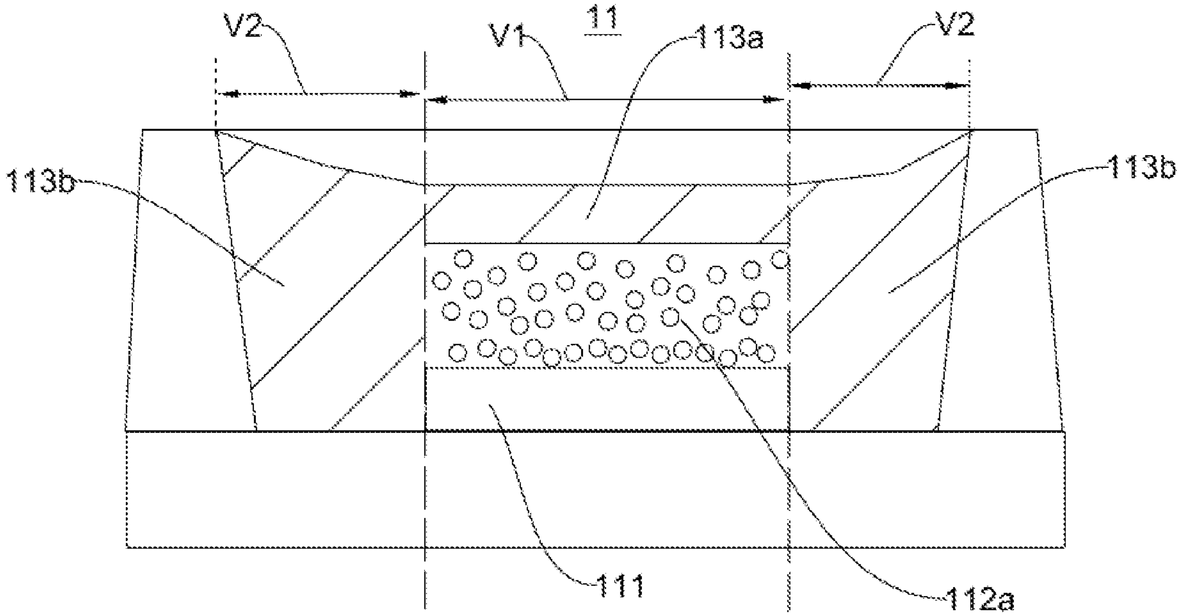

Referring to FIG. 14B, for example, the first red fluorescent adhesive layer may only cover the first blue light emitting chip 111, that is to say, the first red fluorescent adhesive layer 112*a* is formed in the upper region V1, and the second red fluorescent adhesive layer is arranged on a side of the first red fluorescent adhesive layer facing away from the first blue light emitting chip 111, and the second red fluorescent adhesive layer is also arranged in the peripheral region V2, that is to say, the second red fluorescent adhesive layer 113*a* is formed in the upper region V1, and second red fluorescent adhesive layer 113*b* is formed in the peripheral region V2. In the upper region V1, the thickness of the first red fluorescent adhesive layer 112*a* is greater than that of the second red fluorescent adhesive layer 113*a*. To sum up, for the red light emitting unit 11 that requires the dominate wavelength to be in a range of 625 nm to 635 nm, the solution to further improve the brightness is that, in the upper region V1 or the peripheral region V2, the thickness of the first red fluorescent adhesive layer is greater than that of the second red fluorescent adhesive layer.

Finally, it should be noted that the above embodiments are only used to illustrate the technical solutions of the disclosure, not to limit it; Although the disclosure has been described in detail with reference to the preceding embodiments, those skilled in the art should understand that they can still modify the technical solutions recorded in the preceding embodiments, or equivalent replace some of the technical features. These modifications or substitutions do not make the essence of the corresponding technical solutions separate from the spirit and scope of the technical solutions in the embodiments of the disclosure.

What is claimed is:

1. A light emitting device, comprising: a red light emitting unit, a blue light emitting unit, a green light emitting unit, and a white light emitting unit;

wherein the red light emitting unit comprises a first blue light emitting chip and a red fluorescent material, and a dominant wavelength of a light emitted by the red light emitting unit is in a range of 610 nanometers (nm) to 635 nm; and wherein an emission spectrum of the light emitting device has a first peak in a wavelength of 460 nm to 475 nm and a second peak in a wavelength of 515 nm to 535 nm, a full width half maximum (FWHM) corresponding to the first peak increases with the increase of a color temperature of the light emitting device, and the second peak increases with the increase of the color temperature of the light emitting device.

2. The light emitting device according to claim 1, wherein the red fluorescent material comprises a first red phosphor and a second red phosphor, the first red phosphor is a fluoride phosphor, and the second red phosphor is a nitride red phosphor (CASN).

3. The light emitting device according to claim 2, wherein the dominant wavelength of the light emitted by the red light emitting unit is in a range of 610 nm to 625 nm, and a ratio of an intensity of a red light spectrum emitted by the red light emitting unit in a wavelength of 700 nm to an intensity of the red light spectrum emitted by the red light emitting unit in a wavelength of 600 nm is less than or equal to 110%.

4. The light emitting device according to claim 1, wherein an emission spectrum of the red light emitting unit has a third peak in a wavelength of 610 nm to 635 nm, an intensity of the emission spectrum of the red light emitting unit in a wavelength of 445 nm to 460 nm is less than or equal to 10% of an intensity corresponding to the third peak, an intensity of the emission spectrum of the red light emitting unit at a wavelength of 660 nm is in a range of 15% to 40% of the intensity corresponding to the third peak, and the third peak decreases with the increase of the color temperature of the light emitting device.

5. The light emitting device according to claim 1, wherein the green light emitting unit comprises a third blue light emitting chip and a narrow-wavelength green phosphor, and a dominant wavelength of a light emitted by the green light emitting unit is in a range of 535 nm to 550 nm.

6. The light emitting device according to claim 5, wherein the narrow-wavelength green phosphor is (Ba,Sr)2SiO4:Eu phosphor with a peak wavelength of 520-530 nm and an FWHM of 60-70 nm.

7. The light emitting device according to claim 1, wherein the blue light emitting unit comprises at least one blue chip, and a dominant wavelength of the blue chip is in a range of 455 nm to 475 nm.

8. The light emitting device according to claim 1, wherein a color temperature of the white light emitting unit is in a range of 1800 Kelvin (K) to 3000 K.

9. The light emitting device according to claim 1, wherein a color rendering index of the white light emitting unit is less than 80.

10. The light emitting device according to claim 1, wherein an FWHM of a white light emitted by the white light emitting unit is less than or equal to 110 nm.

11. A light emitting device comprising a red light emitting unit, a green light emitting unit, and a blue light emitting unit;

wherein the red light emitting unit comprises a first blue light emitting chip and a red fluorescent material, and a dominant wavelength of a light emitted by the red light emitting unit is in a range of 610 nm to 635 nm;

wherein the red fluorescent material comprises a first red phosphor and a second red phosphor, the first red phosphor is a fluoride phosphor, and the second red phosphor is a CASN; and wherein the first red phosphor is dispersed in silica gel to form a first red fluorescent adhesive layer, the first red fluorescent adhesive layer is arranged on the first blue light emitting chip, the second red phosphor is dispersed in silica gel to form a second red fluorescent adhesive layer, and the second red fluorescent adhesive layer is configured to cover the first red fluorescent adhesive layer and the first blue light emitting chip.

12. The light emitting device according to claim 11, wherein an emission spectrum of the red light emitting unit has a first peak in a wavelength of 610 nm to 635 nm, an intensity of the emission spectrum of the red light emitting unit in a wavelength of 445 nm to 460 nm is less than or equal to 10% of an intensity corresponding to the first peak, and an intensity of the emission spectrum of the red light emitting unit at a wavelength of 660 nm is in a range of 15% to 40% of the intensity corresponding to the first peak.

13. The light emitting device according to claim 11, wherein the dominant wavelength of the light emitted by the red light emitting unit is in a range of 610 nm to 625 nm, and the second red phosphor comprises a long-wavelength nitride red phosphor with a peak wavelength greater than that of the first red phosphor and a short-wavelength nitride red phosphor with a peak wavelength less than that of the first red phosphor, and a ratio of an intensity of a red light spectrum emitted by the red light emitting unit in a wavelength of 700 nm to an intensity of the red light spectrum emitted by the red light emitting unit in a wavelength of 600 nm is less than or equal to 110%.

14. The light emitting device according to claim 11, wherein the dominant wavelength of the light emitted by the red light emitting unit is in a range of 625 nm to 635 nm, a wavelength of the nitride red phosphor is greater than 635 nm, an upper region above the first blue light emitting chip and a peripheral region surrounding the first blue light emitting chip and the upper region are defined in the red light emitting unit, and a thickness of the first red fluorescent adhesive layer is greater than that of the second red fluorescent adhesive layer in the upper region or the peripheral region.

15. A light emitting device comprising a red light emitting unit, a green light emitting unit, and a blue light emitting unit;

wherein the red light emitting unit comprises a first blue light emitting chip and a red fluorescent material, and a dominant wavelength of a light emitted by the red light emitting unit is in a range of 610 nm to 635 nm;

wherein the red fluorescent material comprises a first red phosphor and a second red phosphor, the first red phosphor is a fluoride phosphor, and the second red phosphor is a CASN; and wherein the dominant wavelength of the light emitted by the red light emitting unit is in a range of 610 nm to 625 nm, and the second red phosphor comprises a long-wavelength nitride red phosphor with a peak wavelength greater than that of the first red phosphor and a short-wavelength nitride red phosphor with a peak wavelength less than that of the first red phosphor, and a ratio of an intensity of a red light spectrum emitted by the red light emitting unit in a wavelength of 700 nm to an intensity of the red light spectrum emitted by the red light emitting unit in a wavelength of 600 nm is less than or equal to 110%.

* * * * *